March 3, 1970 B. H. McGAHEY ET AL 3,499,098

INTERCONNECTED MATRIX CONDUCTORS AND METHOD OF MAKING THE SAME

Filed Oct. 8, 1968 2 Sheets-Sheet 1

INVENTORS: B. H. MC GAHEY
E. M. WOODRUFF
BY
Roderick B. Anderson
ATTORNEY

INTERCONNECTED MATRIX CONDUCTORS AND METHOD OF MAKING THE SAME

United States Patent Office 3,499,098

Patented Mar. 3, 1970

3,499,098

INTERCONNECTED MATRIX CONDUCTORS AND METHOD OF MAKING THE SAME

Bruce H. McGahey, South Plainfield, and Earl M. Woodruff, Plainfield, N.J., assignors to Bell Telephone Laboratories, Incorporated, Murray Hill, N.J., a corporation of New York Filed Oct. 8, 1968, Ser. No. 765,855
Int. Cl. H05k *1/04*
U.S. Cl. 174—68.5 11 Claims

ABSTRACT OF THE DISCLOSURE

Each of the conductors of a vertical array and a horizontal array contain a 45 degree segment. By overlapping the vertical array with the horizontal array such that the angular segments of the overlapping conductors are coextensive, each of the horizontal conductors can be connected to one of the vertical conductors by a single thermocompression bonding step.

BACKGROUND OF THE INVENTION

This invention relates to conductor interconnections and methods for making such interconnections.

Modern electronic systems such as computers include multitudes of conductors that must be appropriately interconnected. Many advances have been made in the printed circuit and related arts for expediting these procedures, and the laborious task of stripping insulation from two conductors and soldering them together manually has been largely eliminated in the fabrication of such systems. Nevertheless, an entire system cannot be constructed as a single printed circuit and it is frequently necessary to interconnect or bond large numbers of conductors. Often, the conductors can be arranged in groups or arrays such that each conductor of the first group must be connected to a corresponding conductor of the second group, or a corresponding conductor of each of a number of groups.

In order for conductor arrays to be compatible with the miniaturization of active components (e.g., integrated silicon transistors and diodes) of large electronic systems, the size and spacing of these conductors must be small. Typical conductor widths for miniature components are .007 inch with .014 inch center-to-center spacing. Such small widths and spacings require unique approaches to obtain simple and reliable interconnections.

SUMMARY OF THE INVENTION

In accordance with our invention, the conductors to be interconnected are arranged in arrays such that each conductor of a horizontal array is to be interconnected with a corresponding conductor of a vertical array. Each of the conductors of the vertical and horizontal arrays are made to have a 45 degree segment, the directions and locations of the segments being chosen such that, when the vertical array overlaps the horizontal array, the angular segments overlap and are coextensive. When this is done, the overlapping angular segments lie in a straight line and can be bonded together in a single bonding step; for example, by using an elongated thermode to thermocompression bond the overlapping angular segments simultaneously.

The vertical conductors are preferably formed by printed circuit techniques on a thin, flexible substrate of relatively low melting point, while the horizontal conductors are preferably formed on a relatively high melting point substrate. A single thermode may then thermocompression bond the angular segments in a single stamping operation under appropriate conditions of pressure and temperature which melts the intervening substrate as it bonds the overlapping conductors. This bonding operation yields a good electrical contact between the conductors while the vertical conductor substrate insulates the remaining conductors of the two arrays.

Dependable insulation between the unconnected conductors requires that the horizontal conductor substrate be only locally melted by the thermocompression bond. While this can be controlled by appropriate choices of circuit and thermode parameters, it is preferred that a thin layer of high melting point material be inserted between the horizontal and vertical arrays which has an elongated aperture into which the overlapping angular segments may extend. This thin layer of high melting point material thus prevents the inadvertent contact of adjacent conductors if the vertical conductor substrate melts excessively.

Various other features of the invention will be appreciated from the detailed description to follow. For example, the conductors of the horizontal array each contain a plurality of angular segments to permit bonding to one conductor of each of a plurality of vertical conductor arrays.

DRAWING DESCRIPTION

DETAILED DESCRIPTION

Figure 1:
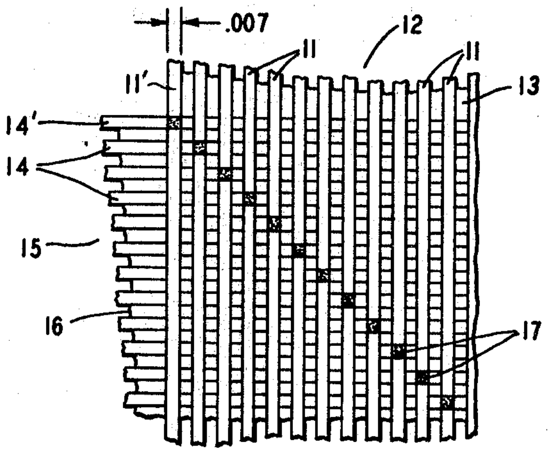
FIG. 1 is an illustration of a relatively straightforward method for interconnecting vertical and horizontal conductors to form a conductor matrix.

Referring now to FIG. 1 there is illustrated a relatively straightforward technique for bonding each of a plurality of conductors 11 of an array 12 to corresponding conductors 14 of an array 15. The array 12 is formed on a thin substrate 13 while the array 15 is formed on a substrate 16. By overlapping the conductors as shown, it is possible to make a succession of thermocompression bonds 17, each of which interconnect one of the horizontal conductors 14 with one of the overlapping vertical conductors 11. As will be explained later in more detail, each interconnection may be made by a thermocompression bond which melts the substrate 13 at the region of the bond such that only those conductors that are bonded are electrically interconnected, with the remaining conductors being insulated by the substrates 13 and 16; for example, horizontal conductor 14' is connected only to vertical conductor 11'.

While recent advances in thermocompression bonding are of advantage in this technique, it can be appreciated that the required interconnections become increasingly troublesome as the number of conductors increase and the width of each conductor decreases. For example, if the width of each conductor is only .007 inch, the area of overlap in which bonding must be performed is only .000049 square inch. If the spacing between each conductor is approximately equal to its width and if each array 12 and 15 contains thirty-two conductors, thirty-two bonding steps would be required in order to interconnect the appropriate conductors in a reliable and reproducible manner.

Figure 2:
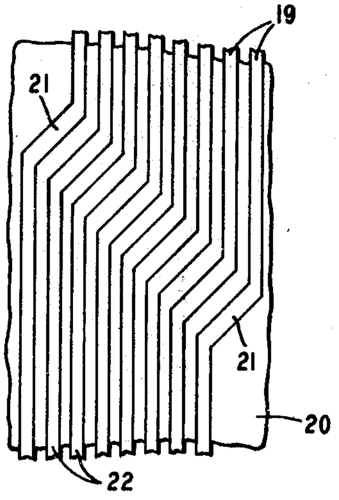
FIG. 2 is an illustration of vertical array conductors made in accordance with one step of the present invention.
Figure 3:
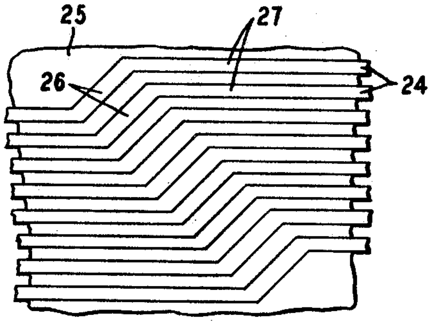
FIG. 3 is an illustration of an array of horizontal conductors made in accordance with another step of the invention.
Figure 4:
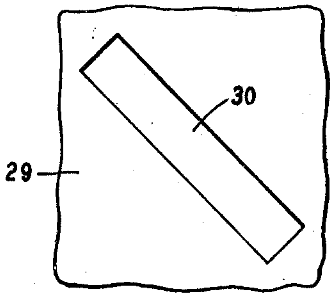
FIG. 4 is an illustration of a spacer that may be used as part of the present invention.
Figure 5:
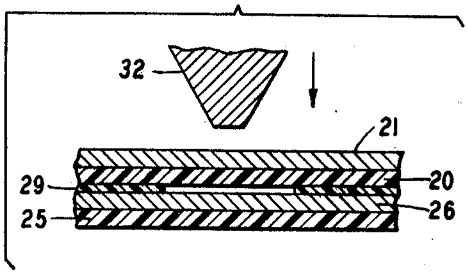
FIGS. 5 and 6 illustrate the bonding of the conductors of FIGS. 2 and 3 in accordance with one step of the invention.

Referring to FIGS. 2 and 3, the present technique includes the step of forming the vertical and horizontal conductors with a 45 degree angular segment. That is, the vertical conductors 19 of FIG. 2 are formed on substrate 20 such as to contain segments 21 that extend at a 45 degree angle with respect to the major portion 22 of the conductors. The horizontal conductors 24 of FIG. 3, formed on substrate 25, have 45 degree angular segments 26 and horizontal major portions 27. The terms horizontal and vertical are, of course, intended to denote only relative orthogonal directions rather than any absolute direction. A spacer element 29 is formed as shown in FIG. 4 having an aperture 30, the dimensions of which approximately correspond to the succession of angular segments 26 and 21 of FIGS. 2 and 3. The spacer 29 is then sandwiched between the two conductor arrays as shown in FIG. 5. The vertical conductors overlay the horizontal conductors such that angular segments 21 overlap and are coextensive with angular segments 26 as shown in FIG. 5.

Figure 6:
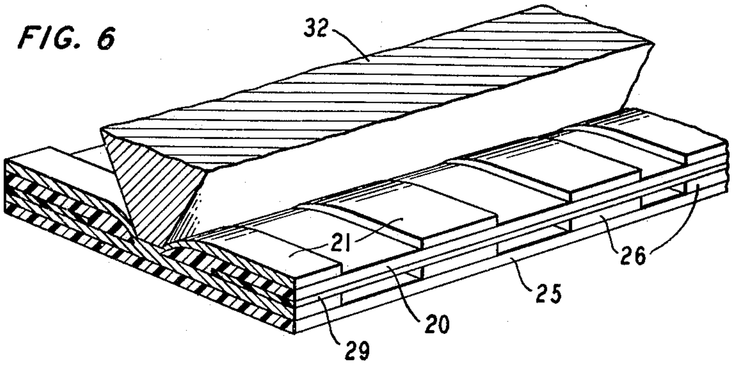

Next, as shown in FIG. 6, a heated thermode 32 strikes the angular segments 21 with sufficient force to melt locally the vertical conductor substrate 20 and to thermocompression bond the angular segments 21 of the vertical conductors to the angular segments 26 of the horizontal conductors. The thermode 32 is sufficiently long to bond all of the overlapping angular segments 21 and 26 in a single stamping operation to interconnect them and to yield the finished conductor matrix shown in FIG. 7. The thermode bonds the conductors 19 and 24 along a straight bond line 33. Notice that in spite of the fact that all of the connections are made in the single stamping operation, each horizontal conductor is connected only with the coresponding vertical conductor; for example, conductor 24' is connected only to vertical conductor 19' and is insulated from all of the other conductors of the matrix.

Figure 7:
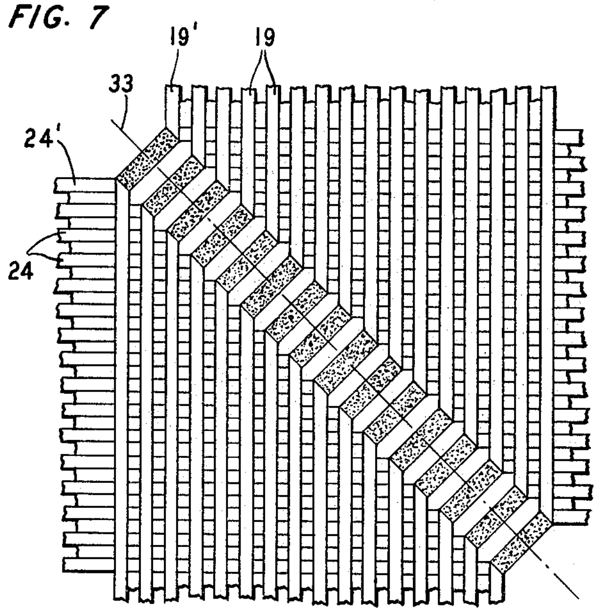
FIG. 7 illustrates part of a conductor matrix made in accordance with the invention.
Figure 8:
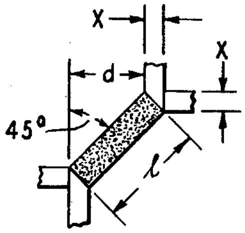
FIG. 8 is an enlarged view of one interconnection in the matrix of FIG. 7.

It is quite apparent from a comparison of FIGS. 7 and 1 that the present invention substantially expedites the interconnecting of corresponding conductors of two groups or arrays by accomplishing, in a single bonding step, that which would ordinarily require numerous bonding steps. FIG. 8 illustrates that, in addition, the present technique reduces the conductor registration and thermode tolerances required for thermocompression bonding. If the width of each conductor is X as shown, and if the distance $d$ is made equal to 4 times the conductor width, then the length $l$ of each of the angular segments is $4X\sqrt{2}$, and the total available bonding area is $8X^2$, as compared to only $X^2$ as in the case of the FIG. 1 technique. With the bonding area increased by a factor of eight, the thermode tolerances can, of course, be substantially reduced. Moreover, dimension $d$ of FIG. 8 could obviously be increased if so desired to increase further the bonding area.

The spacer 29 of FIGS. 4 through 6 is not essential to the successful practice of the invention, but experiments have shown that where the bond area is extremely small, it is difficult to restrict the applied heat to an extent sufficient to give only local melting of the vertical conductor substrate 20 while avoiding substrate melting outside the bond area. With the high melting point spacer, the vertical conductors are insulated from the horizontal conductors even if substrate melting is not entirely localized.

In one successful demonstration of the technique, the vertical conductors were 1 oz. copper conductors, the substrate 20 was a 1 mil thick polyester film known commercially as Mylar, the spacer 29 was a ½ mil thick polymide film known commercially as Kapton, the horizontal conductors were ¾ oz. copper conductors and the substrate 25 was 1 mil. thick Kapton. The Mylar substrate was originally clad with copper and subsequently etched to form the vertical conductors. The horizontal conductors were etched from a copper clad Kapton material which is commercially available under the name Lashclad. The horizontal and vertical conductors were .007 inch wide with 45 degree angular segments as shown in the figures. The thermode 32 was operated at 1395° F. with an applied pressure of 41,000 lbs. per square inch and a bonding duration of approximately one second. In accordance with known procedures in the thermocompression bonding art, some care was taken, such as by the use of a fairly high conductivity supporting base fixture and heat sink clamps, to provide an appropriate thermal path to control heat localization. Also, the base fixture was permitted to pivot through an angle of less than one degree to enhance uniform distribution of bonding pressure. The thermode or heated element was machined from Inconel alloy #718, which was chosen since it does not oxide heavily when operated at high temperatures in air for long time periods. These parameters are, of course, by no means essential and are given only for purposes of illustration.

Figure 9:
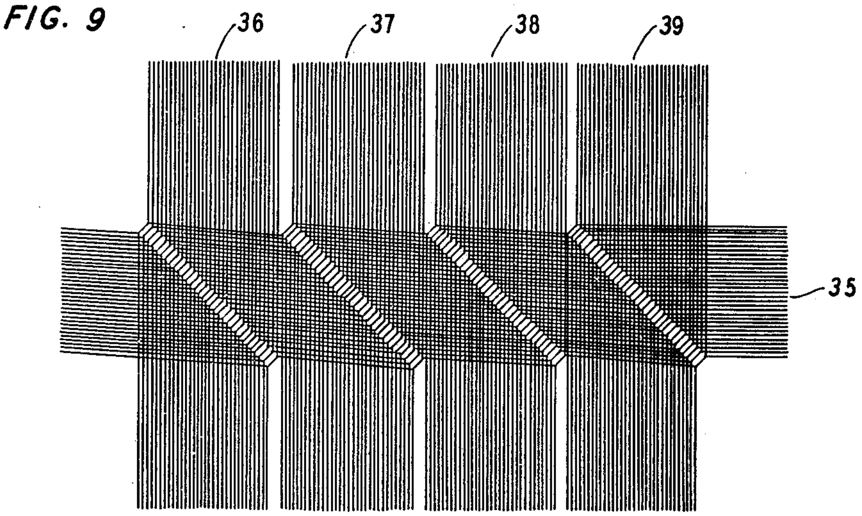
FIG. 9 illustrates how one horizontal array can be connected to a plurality of vertical arrays in accordance with the invention.

The particular system which stimulated the invention was a plated wire memory system of the general type described in the copending application of T. R. Finch et al., Ser. No. 591,237, filed Nov. 1, 1966 and assigned to Bell Telephone Laboratories, Incorporated. Referring to FIG. 9, thirty-two word rail conductors 35 were connected to four arrays of word line conductors 36 through 39, each of which included thirty-two conductors. Each of the word line arrays, of course, contains angular segments as shown in FIG. 2. The 128 separate interconnections were made by only four bonding steps as can be seen from FIG. 9. Notice that the conductors 35 are not quite orthogonal to conductors 36–39; the slight angular deviations permit successive bond areas to lie symmetrically along a common horizontal axis. For purposes of consistency of description, conductors 35 should be considered vertical and conductors 36–39 should be considered horizontal.

While it is preferred that both vertical and horizontal conductors contain 45 degree angular segments for purposes of symmetry and to maximize the bonding area, segments extending at other angles can alternatively be used. However, if the conductors are to form an orthogonal matrix, and if the overlapping segments are to be coextensive, then the segments of the vertical conductors should extend at a first angle and the horizontal conductors should extend at 90 degrees minus the first angle. While the technique is particularly useful in conjunction with printed circuits and the thermocompression bonding method described, other conductor configurations and bonding methods can alternatively be used.

Various other modifications and embodiments may be made by those skilled in the art without departing from the spirit and scope of the invention.

What is claimed is:

1. The method of bonding each of an array of substantially vertically extending elongated elements to a corresponding element of an array of substantially horizontally extending elongated elements comprising the steps of:

providing a segment in each vertical element extending at a first angle with respect to the remainder of the vertical element;

arranging the vertical elements with successive segments mutually parallel and adjacent;

providing a segment in each horizontal element extending at a second angle with respect to the remainder of the horizontal element, the second angle being substantially equal to 90 degrees minus the first angle;

arranging the vertical elements with each angular segment thereof overlapping an angular segment of a corresponding horizontal element;

and bonding all of the vertical element angular segments to the horizontal element angular segments which they overlap.

2. The method of claim 1 wherein the elements are of metal and further comprising the steps of:

forming the vertical elements on a thin insulative substrate;

and wherein the bonding step comprises the step of simultaneously contacting all of the angular segments of the vertical elements with an elongated heated element of sufficient temperature and pressure to melt locally the insulative substrate and to bond the horizontal and vertical elements.

3. The method of claim 2 wherein:

the first angle and the second angle are each substantially 45 degrees;

and the elongated thermode extends at substantially 45 degrees with respect to the major portions of the horizontal and vertical elements.

4. The method of connecting each of a plurality of first conductors to one of a plurality of second conductors comprising the steps of:

forming the conductors such that they each have major segments joined by substantially 45 degree angular segments;

arranging the first conductors in a first parallel array;

arranging the second conductors in a second parallel array such that they overlap the first conductors, with the major portion of the first conductors being substantially orthogonal to the major portions of the second conductors, and the angular segments of the first conductors overlapping and being substantially coextensive with the angular segments of the second conductors;

and simultaneously bonding the overlapping angular segments comprising the step of contacting the angular segments of the second conductors with an elongated heated element.

5. The method of claim 4 further comprising the steps of:

forming the first conductors on a first substrate;

forming the second conductors on a second substrate of relatively low melting point material;

forming a spacer element of relatively high melting point material with an elongated aperture therein;

and inserting the spacer element between the conductor arrays such that the overlapping angular segments extend into the aperture.

6. The method of claim 4 wherein:

the major portions of the first and second conductors are of substantially the same width;

and the width of the angular segments of the first and second conductors are each substantially equal to $\sqrt{2}$ times the width of each major portion, thereby increasing the bonding areas of the overlapping segments.

7. The method of claim 4 further including the method of connecting each of the first conductors to one of a plurality of third conductors and to one of a plurality of fourth conductors comprising the steps of forming the second conductors such that they each contain three substantially 45 degree angular segments;

arranging the third conductors in a third parallel array;

arranging the fourth conductors in the fourth parallel array;

arranging the second conductors such that they overlap the third and fourth conductors, with the major portions of the second conductors being substantially orthogonal to the major portions of the third and fourth conductors and with one angular segment of each of the second conductors overlapping and being substantially coextensive with the angular segment of one of the third conductors, and another angular segment of each of the second conductors overlapping and being substantially coextensive with the angular segment of one of the fourth conductors;

simultaneously bonding the overlapping angular segments of the second and third conductors;

and simultaneously bonding the overlapping angular segments of the second and fourth conductors.

8. A conductor matrix comprising:

a plurality of first conductors, a major portion of which extends vertically;

a plurality of second conductors, a major portion of which extends horizontally;

a segment in each vertical conductor extending at a first angle with respect to the major portion of the conductor;

and a segment in each horizontal conductor extending at a second angle with respect to the major portion of the horizontal element, the second angle being substantially equal to 90 degrees minus the first angle;

the angular segment of each of the vertical elements overlapping and being bonded to the angular segment of a corresponding horizontal conductor at a bonding region;

the bonding regions of the overlapped angular segments lying substantially in a straight line.

9. The conductor matrix of claim 8 wherein:

the vertical conductors are formed on a first substrate;

and the horizontal conductors are formed on a second substrate.

10. The conductor matrix of claim 9 wherein:

the first substrate is of relatively low melting point material;

the second substrate is of relatively high melting point material;

and the bonds between overlapping angular segments are thermocompression bonds.

11. The conductor matrix of claim 10 further comprising:

a layer of relatively high melting point material having therein an elongated aperture and included between the first substrate and second conductors; and wherein:

the angular segments of the vertical conductors protrude through the first substrate and into said aperture.

References Cited

UNITED STATES PATENTS

| | | | |
|---|---|---|---|
| 2,019,625 | 11/1935 | O'Brien. | |
| 2,872,565 | 2/1959 | Brooks | 174—84 XR |
| 2,977,672 | 4/1961 | Telfer | 174—68.5 XR |
| 3,300,851 | 1/1967 | Lodder. | |

DARRELL L. CLAY, Primary Examiner

U.S. Cl. X.R.

29—625, 628; 317—101; 339—18